United States Patent
Chang et al.

(10) Patent No.: US 9,148,276 B2
(45) Date of Patent: Sep. 29, 2015

(54) HALF-RATE CLOCK AND DATA RECOVERY CIRCUIT

(71) Applicants: NCKU Research and Development Foundation, Tainan (TW); Himax Technologies Limited, Tainan (TW)

(72) Inventors: Soon-Jyh Chang, Tainan (TW); Yen-Long Lee, Tainan (TW); Jin-Fu Lin, Tainan (TW)

(73) Assignees: NCKU Research and Development Foundation, Tainan (TW); Himax Technologies Limited, Tainan (TW)

( * ) Notice: Subject to any disclaimer, the term of this patent is extended or adjusted under 35 U.S.C. 154(b) by 0 days.

(21) Appl. No.: 14/182,238

(22) Filed: Feb. 17, 2014

(65) Prior Publication Data

US 2015/0236845 A1    Aug. 20, 2015

(51) Int. Cl.
   *H03D 3/24* (2006.01)
   *H04L 7/033* (2006.01)
   *H04L 7/00* (2006.01)

(52) U.S. Cl.
   CPC ............ *H04L 7/0331* (2013.01); *H04L 7/0087* (2013.01)

(58) Field of Classification Search
   CPC ..... H03L 7/0896; H03L 7/087; H03L 7/0891; H03L 7/095; H04L 7/033; H04L 7/0331; H04L 7/0087
   USPC .......... 375/374, 373, 371, 375, 376; 327/147, 327/148, 156, 157
   See application file for complete search history.

(56) References Cited

PUBLICATIONS

Gaowei Gu ; En Zhu ; Ye Lin; "A Gated VCO for 10Gb/s PON Systems in 0.18 μm CMOS," Second International Conference onFuture Networks, 2010. ICFN '10, pp. 261-264.*
Gu Gaowei, Zhu EnZ, Lin Ye, and Liu Wensong, "A 10 Gb/s burst-mode clock and data recovery circuit," Journal of Semiconductors, vol. 33, No. 7, Jul. 2012.*
Armin Tajalli; Paul Muller; Mojtaba Atarodi; and Yusuf Leblebici; "A Low-Power, Multichannel Gated Oscillator-Based CDR for Short-Haul Applications," Proceedings of the 2005 International Symposium on Low Power Electronics and Design, 2005. ISLPED '05, 2005 , pp. 107-110.*
Yen-Long Lee, Soon-Jyh Chang, Rong-Sing Chu, Yen-Chi Chen, Jih Ren Goh, and Chung-Ming Huang, "An Area-and Power-Efficient Half-Rate Clock and Data Recovery Circuit," 2014 IEEE International Symposium onCircuits and Systems (ISCAS), 2014 , pp. 2129-2132.*
Liang, Che-Fu et al., "A Jitter-Tolerance-Enhanced CDR Using a GDCO-Based Phase Detector," IEEE Journal of Solid-State Circuits, Vol. 43, No. 5, May 2008, pp. 1217-1226.

* cited by examiner

*Primary Examiner* — Shuwang Liu
*Assistant Examiner* — Nader Bolourchi
(74) *Attorney, Agent, or Firm* — Donald E. Stout; Stout, Uxa & Buyan, LLP

(57) ABSTRACT

A half-rate clock and data recovery (CDR) circuit includes a first and a second gated voltage-controlled oscillators (GVCOs) and a first and a second frequency detectors. The first frequency detector generates a first output current according to a reference signal and a second divided clock, and the second frequency detector generates a second output current according to a first divided clock and the second divided clock. A loop filter converts either the first output current or the second output current to a first control voltage to control the second clock, and generates a second control voltage according to the first control voltage to control the first clock. A lock detector receives the reference signal and the second divided clock, and accordingly generates a lock signal.

12 Claims, 4 Drawing Sheets

HALF-RATE CLOCK AND DATA RECOVERY CIRCUIT

BACKGROUND OF THE INVENTION

1. Field of the Invention

The present invention generally relates to clock and data recovery, and more particularly to a half-rate clock and data recovery circuit.

2. Description of Related Art

Clock and data recovery (CDR) is a crucial building block adopted in a receiver of a wireline communication system, such as an optical-fiber or a serial-link system. Jitter tolerance and jitter transfer function are two important parameters to characterize a CDR circuit. The jitter tolerance is defined as the maximum amplitude of a sinusoidal jitter that is tolerated without increasing a bit error rate (BER). The jitter transfer function is defined as an output jitter divided by an input jitter varying at difference rates. In order to enhance the jitter tolerance of a CDR circuit, a loop bandwidth needs to be increased. The increased loop bandwidth, nevertheless, degrades the jitter transfer function. Therefore, a compromise needs to be reached between the jitter tolerance and the jitter transfer function in a conventional CDR circuit.

For the foregoing reason, a need has thus arisen to propose a novel CDR circuit with enhanced jitter tolerance without sacrificing the jitter transfer function.

SUMMARY OF THE INVENTION

In view of the foregoing, it is an object of the embodiment of the present invention to provide an area- and power-efficient half-rate clock and data recovery (CDR) circuit with enhanced jitter tolerance without changing the jitter transfer function.

According to one embodiment, a half-rate clock and data recovery (CDR) circuit includes a first gated voltage-controlled oscillator (GVCO), a second GVCO, a first frequency detector, a second frequency detector, a loop filter and a lock detector. The first GVCO generates a first clock oscillating at about half a frequency of an input data, and the second GVCO generates a second clock oscillating at about half the frequency of the input data. The first frequency detector receives a reference signal and a second divided clock derived from the second clock, and generates a first output current according to the reference signal and the second divided clock. The second frequency detector receives the second divided clock and a first divided clock derived from the first clock, and generates a second output current according to the first divided clock and the second divided clock. The loop filter converts either the first output current or the second output current to a first control voltage that is then fed to the second GVCO to control an oscillation frequency of the second clock, and the loop filter generates a second control voltage according to the first control voltage, the second control voltage then being fed to the first GVCO to control an oscillation frequency of the first clock. The lock detector receives the reference signal and the second divided clock, and accordingly generates a lock signal.

DETAILED DESCRIPTION OF THE INVENTION

Figure 1:
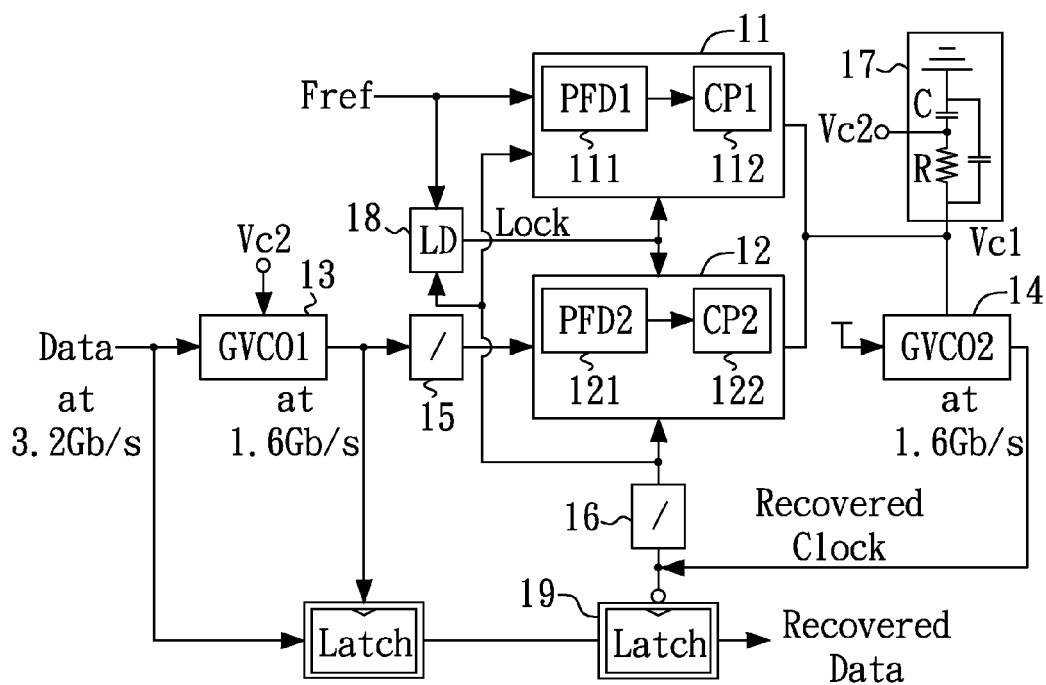
FIG. 1 shows a block diagram illustrating a half-rate clock and data recovery (CDR) circuit according to one embodiment of the present invention.

FIG. 1 shows a block diagram illustrating a half-rate clock and data recovery (CDR) circuit 100 according to one embodiment of the present invention. In the embodiment, the CDR circuit 100 primarily includes a first frequency detector 11, a second frequency detector 12, a first (half-rate) gated voltage-controlled oscillator (GVCO1) 13 and a second (half-rate) gated voltage-controlled oscillator (GVCO2) 14. The first gated voltage-controlled oscillator 13 and the second gated voltage-controlled oscillator 14 generate a first clock and a second clock, respectively. The first gated voltage-controlled oscillator 13 and the second gated voltage-controlled oscillator 14 oscillate at a frequency about half the frequency of an input data, therefore resulting in a half-rate clock and data recovery (CDR) circuit. In one example, an input data rate is 3.2 Gb/s, and the frequency of the first clock and the second clock is 1.6 Gb/s.

Specifically, the first frequency detector 11 is coupled to receive a reference signal (having a reference frequency Fref) and a (second) divided clock, where the second divided clock is obtained from a (second) frequency divider 16 which divides a frequency of the second clock (e.g., divided by 8). According to frequency difference between the reference signal and the second divided clock, the first frequency detector 11 therefore generates a first output current, which is then converted into a (first) control voltage Vc1 by a loop filter 17. The first control voltage Vc1 is then fed to the second gated voltage-controlled oscillator 14 to control an oscillation frequency of the second clock.

On the other hand, the second frequency detector 12 is coupled to receive a (first) divided clock and the second divided clock, where the first divided clock is obtained from a (first) frequency divider 15 which divides a frequency of the first clock (e.g., divided by 8). According to frequency difference between the first divided clock and the second divided clock, the second frequency detector 12 therefore generates a second output current, which is then converted into the (first) control voltage Vc1 by the loop filter 17. The first control voltage Vc1 is then fed to the second gated voltage-controlled oscillator 14 to control an oscillation frequency of the second clock. It is noted that, as only one of the first frequency detector 11 and the second frequency detector 12 operates at a time (while the other is turned off or idle), the control voltages generated from the first frequency detector 11 and the second frequency detector 12 are designated by the same symbol Vc1, and are referred to as the first control voltage.

The first frequency detector 11 of the embodiment may include a phase frequency detector (PFD1) 111, which receives the reference signal and the second divided clock, and accordingly generates an output being proportional to a frequency difference between the reference signal and the second divided clock. The first frequency detector 11 of the embodiment may also include a charge pump (CP1) 112, which transforms the output of the PFD 111 into the first output current. Similarly, the second frequency detector 12 may include a phase frequency detector (PFD2) 121, which receives the first divided clock and the second divided clock, and accordingly generates an output being proportional to a frequency difference between the first divided clock and the second divided clock. The second frequency detector 12 may also include a charge pump (CP2) 122, which transforms the output of the PFD 121 into the second output current.

In the embodiment, the loop filter 17 generates a second control voltage Vc2 according to the first control voltage Vc1. The second control voltage Vc2 is then fed to the first gated voltage-controlled oscillator 13 to control an oscillation frequency of the first clock. Specifically, the loop filter 17 of the embodiment may include a low-pass filter, which is composed of a resistor R and a capacitor C connected in series and electrically coupled between the first control voltage Vc1 and a ground. The second control voltage Vc2 is a low-pass output voltage from the low-pass filter. In a steady state, the first control voltage Vc1 and the second control voltage Vc2 are substantially equal.

Figure 2:
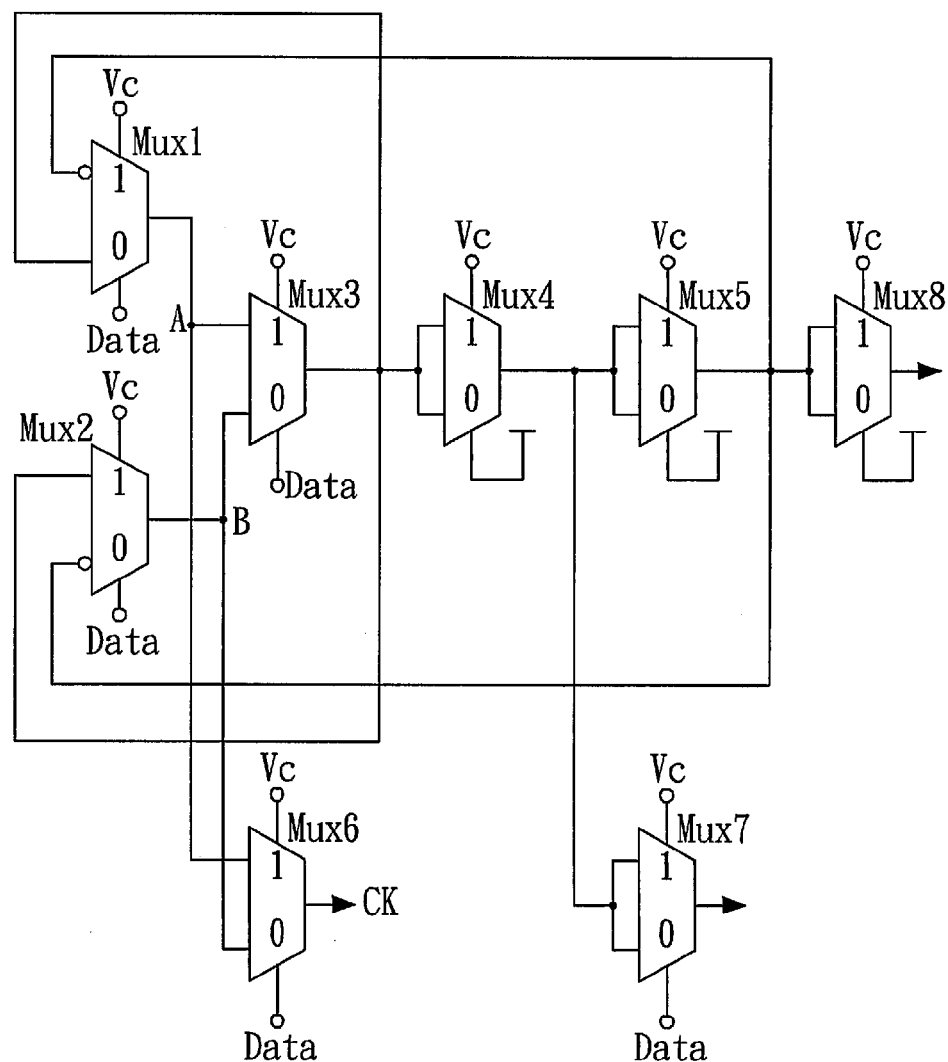
FIG. 2 shows a detailed circuit of the first/second gated voltage-controlled oscillator of FIG. 1.

FIG. 2 shows a detailed circuit of a gated voltage-controlled oscillator (GVCO) adaptable to either the first gated voltage-controlled oscillator 13 or the second gated voltage-controlled oscillator 14. In the figure, Vc represents a control voltage that may be either Vc1 (for the second gated voltage-controlled oscillator 14) or Vc2 (for the first gated voltage-controlled oscillator 13); CK represents a clock that may be either the first clock (for the first gated voltage-controlled oscillator 13) or the second clock (for the second gated voltage-controlled oscillator 14).

Specifically, the GVCO of FIG. 2 may include two four-stage ring oscillators. When an input data is high (in logic level), four multiplexers Mux1, Mux3, Mux4 and Mux5 constitute the first four-stage ring oscillator, where the multiplexers Mux1, Mux3, Mux4 and Mux5 are connected in series, an output of the fourth multiplexer Mux5 is inverted and fed back to an input of the first multiplexer Mux1, and an output of the second multiplexer Mux3 is fed back to another input of the first multiplexer Mux1. Every multiplexer in the first four-stage ring oscillator contributes phase shift of 45°, and a phase difference between node A and node B (i.e., two input nodes of the second multiplexer Mux3) is 90°.

On the other hand, when the input data is low (in logic level), four multiplexers Mux2, Mux3, Mux4 and Mux5 constitute the second four-stage ring oscillator, where the multiplexers Mux2, Mux3, Mux4 and Mux5 are connected in series, an output of the fourth multiplexer Mux5 is inverted and fed back to an input of the first multiplexer Mux1, and an output of the second multiplexer Mux3 is fed back to another input of the first multiplexer Mux2. A phase difference between node A and node B is also 90°. It is noted that the second to the fourth multiplexers of the first four-stage ring oscillator and the second to the fourth multiplexers of the second four-stage ring oscillator share the same multiplexers Mux3-Mux5.

The GVCO of FIG. 2 may include a buffer multiplexer Mux6 with two inputs coupled to the node A and the node B, respectively, therefore generating the output clock CK. The GVCO of FIG. 2 may further include two dummy multiplexers Mux7 and Mux8, utilized to balance the output loading of Mux4 and Mux5, respectively. The control voltage Vc sets the GVCO to oscillate at a required frequency. The GVCO may achieve quick phase locking by adjusting a phase of its output clock CK by the transition edge of the input data.

Referring back to FIG. 1, the CDR circuit 100 of the embodiment may further include a lock detector (LD) 18, which is coupled to receive the reference signal and the second divided clock. When a frequency difference between the reference signal and the second divided clock is within a predetermined lock-in range, the lock detector 18 generates a lock signal (Lock) to turn on the second frequency detector 12 (while turning off the first frequency detector 11), otherwise the lock detector 18 generates a lock signal (Lock) to turn on the first frequency detector 11 (while turning off the second frequency detector 12).

The CDR circuit 100 of the embodiment may include a latch 19 coupled to receive an input data, which are sampled at rising and falling edges of the second clock, therefore generating recovered data. In the embodiment, the latch 19 may be composed of a number of D-type flip-flops (DFF) that are connected in series.

Figure 3:
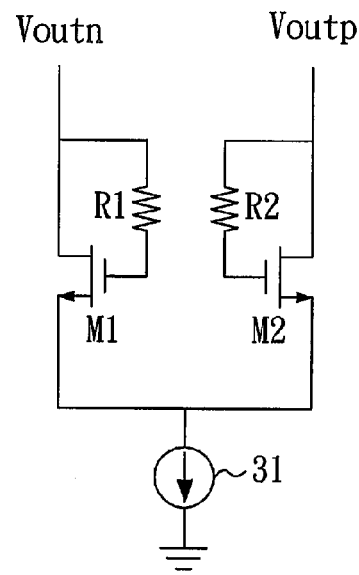
FIG. 3 shows a circuit illustrating an active inductive load adaptable to the first/second gated voltage-controlled oscillator of FIG. 1.

According to one aspect of the embodiment, an active inductive load may be used in the first/second gated voltage-controlled oscillator 13/14 to decrease complexity and achieve high oscillation frequency with low power dissipation. FIG. 3 shows a circuit illustrating an active inductive load 300 according to one embodiment of the present invention. In the embodiment, the active inductive load 300 may be composed of two branches, i.e., a first branch and a second branch, first ends of which are respectively coupled to a positive output and a negative output of a multiplexer (FIG. 2). Second ends of the first and the second branches are coupled to a ground via a current source 31. Each branch may include an N-type metal-oxide-semiconductor (NMOS) transistor M1/M2 with source terminals coupled to the current source 31, drain terminals respectively coupled to the positive and negative outputs of the multiplexer. Each branch may also include a resistor R1/R2 connected between the drain terminal and a gate terminal of the corresponding NMOS transistor M/M2. The active inductive load 300 may reduce body effect, and an output swing is unchanged because the NMOS transistors M1 and M2 still stay in a saturation region when an output voltage is at the lowest value. Hence, the active inductive load 300 may increase the oscillation frequency and reduce power dissipation.

Figure 4:
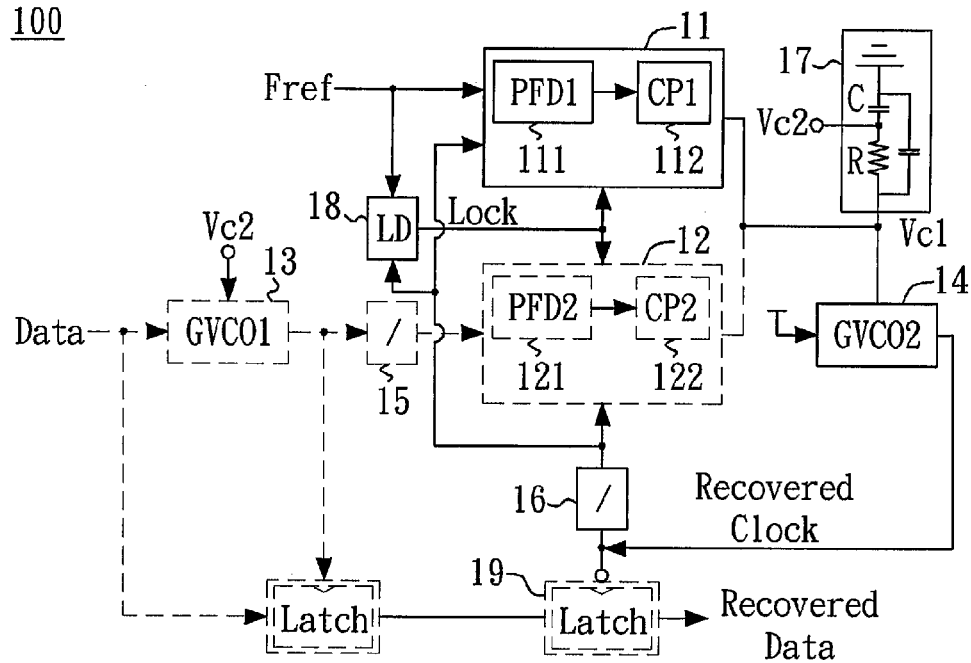
FIG. 4 shows the CDR circuit of FIG. 1 with solid lines indicating signal processing paths and blocks in a frequency presetting mode.

The CDR circuit 100 demonstrated above may have two operating modes: frequency presetting mode and data recovery mode. FIG. 4 shows the CDR circuit 100 with solid lines indicating signal processing paths and blocks in the frequency presetting mode, and FIG. 5 shows the CDR circuit 100 with solid lines indicating signal processing paths and blocks in the data recovery mode.

Referring to FIG. 4, in the frequency presetting mode, the phase frequency detector (PFD1) 111 of the first frequency detector 11 monitors the frequency difference between the reference signal and the second divided clock. The charge pump (CP1) 112 of the first frequency detector 11 transforms the frequency difference into the first output current that is proportional to the frequency difference. Then, the loop filter 17 converts the first output current to the first control voltage Vc1, which prompts the first gated voltage-controlled oscillator 13 and the second gated voltage-controlled oscillator 14 to oscillate at the predetermined half-rate first clock and second clock, respectively. The first control voltage Vc1 and the second control voltage Vc2 on the loop filter 17 are equal in a steady state. According to one aspect of the embodiment, the charge pump (CP2) of the second frequency detector 12 is turned off in this mode to reduce power consumption. The lock detector 18 always monitors the frequency difference between the reference signal and the second divided clock in the two modes. When the frequency difference is within the predetermined lock-in range, the first gated voltage-controlled oscillator 13 and the second gated voltage-controlled oscillator 14 oscillate at the same target frequency, and the frequency presetting mode is complete.

Figure 5:
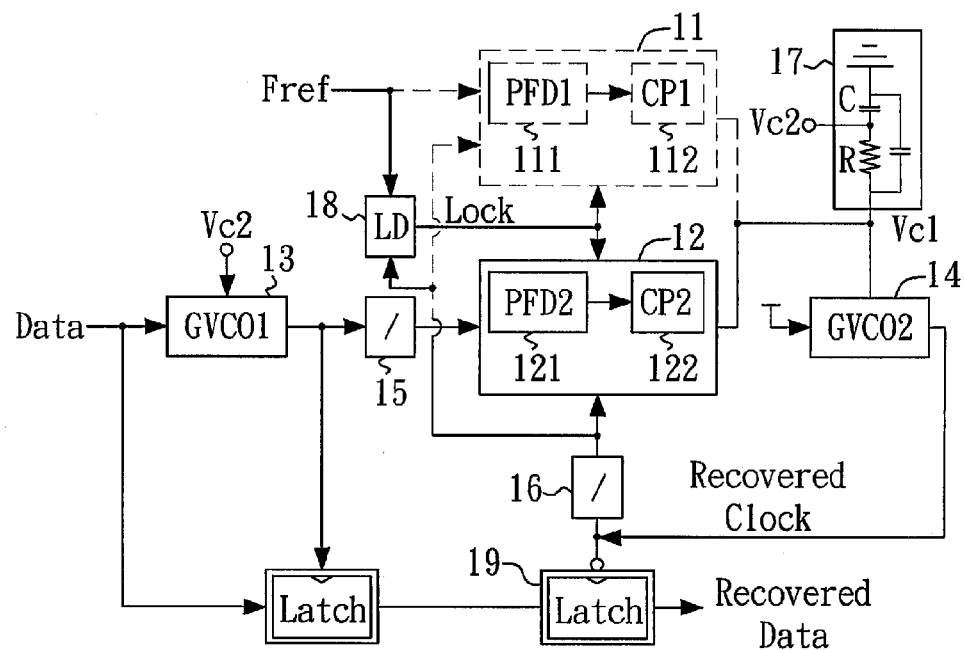
FIG. 5 shows the CDR circuit of FIG. 1 with solid lines indicating signal processing paths and blocks in a data recovery mode.

Next, as shown in FIG. 5, in the data recovery mode, as the first control voltage Vc1 and the second control voltage Vc2 are equal at the end of the frequency presetting mode, the first gated voltage-controlled oscillator 13 and the second gated voltage-controlled oscillator 14 oscillate at the same target frequency. The phase of the first clock of the first gated voltage-controlled oscillator 13 is determined by the input data, and the second clock of the second gated voltage-controlled oscillator 14 tracks it to accomplish phase locking by adjusting the first control voltage Vc1 inputting to the second gated voltage-controlled oscillator 14. If the lock detector 18 discovers that the frequency difference between the reference signal and the second divided clock is out of the lock-in range, the operating mode will be switched to frequency presetting mode.

Although specific embodiments have been illustrated and described, it will be appreciated by those skilled in the art that various modifications may be made without departing from the scope of the present invention, which is intended to be limited solely by the appended claims.

What is claimed is:

1. A half-rate clock and data recovery (CDR) circuit, comprising:
   a first gated voltage-controlled oscillator configured to generate a first clock oscillating at about half a frequency of an input data;
   a second gated voltage-controlled oscillator configured to generate a second clock oscillating at about half the frequency of the input data;
   a first frequency detector coupled to receive a reference signal and a second divided clock derived from the second clock, and configured to generate a first output current according to the reference signal and the second divided clock, the first frequency detector being turned off in data recovery mode to reduce power consumption;
   a second frequency detector coupled to receive the second divided clock and a first divided clock derived from the first clock, and configured to generate a second output current according to the first divided clock and the second divided clock, the second frequency detector being turned off in frequency presetting mode to reduce power consumption;
   a loop filter configured to convert either the first output current or the second output current to a first control voltage that is then fed to the second gated voltage-controlled oscillator to control an oscillation frequency of the second clock, and the loop filter configured to generate a second control voltage according to the first control voltage, the second control voltage then being fed to the first gated voltage-controlled oscillator to control an oscillation frequency of the first clock; and
   a lock detector coupled to receive the reference signal and the second divided clock, and configured to accordingly generate a lock signal.

2. The CDR circuit of claim 1, further comprising a first frequency divider configured to generate the first divided clock by dividing a frequency of the first clock.

3. The CDR circuit of claim 1, further comprising a second frequency divider configured to generate the second divided clock by dividing a frequency of the second clock.

4. The CDR circuit of claim 1, wherein the first frequency detector comprises:
   a phase frequency detector coupled to receive the reference signal and the second divided clock, and configured to generate an output being proportional to a frequency difference between the reference signal and the second divided clock; and
   a charge pump configured to transform the output of the phase frequency detector into the first output current.

5. The CDR circuit of claim 1, wherein the second frequency detector comprises:
   a phase frequency detector coupled to receive the first divided clock and the second divided clock, and configured to generate an output being proportional to a frequency difference between the first divided clock and the second divided clock; and
   a charge pump configured to transform the output of the phase frequency detector into the second output current.

6. The CDR circuit of claim 1, wherein the loop filter comprises a low-pass filter electrically coupled between the first control voltage and a ground, the second control voltage being a low-pass output voltage from the low-pass filter.

7. The CDR circuit of claim 1, wherein the first or the second gated voltage-controlled oscillator comprises:
   a first ring oscillator composed of a plurality of multiplexers connected in series;
   a second ring oscillator composed of a plurality of multiplexers connected in series, one of the first ring oscillator and the second ring oscillator being activated according to logic level of the input data; and
   a buffer multiplexer with two inputs respectively coupled to two inputs of the second one of the multiplexers of the first or the second ring oscillator, thereby generating the first clock or the second clock;
   wherein all except the first one of the multiplexers of the first ring oscillator and all except the first one of the multiplexers of the second ring oscillator share the same multiplexers; and
   wherein an output of the last one of the multiplexers of the first or the second ring oscillator is inverted and fed back to inputs of the first ones of the multiplexers of the first and the second ring oscillators, and an output of the second one of the multiplexers of the first or the second ring oscillator is fed back to another inputs of the first ones of the multiplexers of the first and the second ring oscillators.

8. The CDR circuit of claim 1, further comprising a latch coupled to receive the input data, which are sampled at rising and falling edges of the second clock, therefore generating recovered data.

9. The CDR circuit of claim 8, wherein the latch comprises a plurality of D-type flip-flops (DFF) that are connected in series.

10. The CDR circuit of claim 1, further comprising an active inductive load composed of a first branch and a second branch, first ends of which are respectively coupled to a positive output and a negative output of a multiplexer of the first or the second gated voltage-controlled oscillator, second ends of the first and the second branches being coupled to a ground via a current source.

11. The CDR circuit of claim 10, wherein the first and the second branches each comprises:
   an N-type metal-oxide-semiconductor (NMOS) transistor with a source terminal coupled to the current source, a drain terminal coupled to the positive or the negative output of the multiplexer; and
   a resistor connected between the drain terminal and a gate terminal of the corresponding NMOS transistor.

12. The CDR circuit of claim 1, wherein the lock signal turns on the second frequency detector and turns off the first frequency detector when a frequency difference between the reference signal and the second divided clock is within a predetermined lock-in range; otherwise the lock signal turns on the first frequency detector and turns off the second frequency detector.

* * * * *